United States Patent [19]

Shon

[11] Patent Number: 5,796,755
[45] Date of Patent: Aug. 18, 1998

[54] ERROR MINIMIZATION IN INTERLEAVED ERROR CORRECTING CODES

[75] Inventor: Russell D. Shon, San Diego, Calif.

[73] Assignee: Eastman Kodak Company, Rochester, N.Y.

[21] Appl. No.: 666,171

[22] Filed: Jun. 19, 1996

[51] Int. Cl.⁶ .................................................. H03M 13/22
[52] U.S. Cl. ................................................... 371/39.1
[58] Field of Search ........................................ 371/39.1

[56] References Cited

U.S. PATENT DOCUMENTS

| | | |
|---|---|---|
| 4,882,732 | 11/1989 | Kaminaga .................... 371/2.2 |
| 4,953,168 | 8/1990 | Odaka ........................ 371/37.4 |
| 5,068,878 | 11/1991 | Lin et al. ..................... 375/111 |
| 5,299,208 | 3/1994 | Blaum et al. ................ 371/38.1 |

*Primary Examiner*—Stephen M. Baker
*Attorney, Agent, or Firm*—William F. Noval

[57] ABSTRACT

Digital data which has been error correcting code encoded includes a sequence of codeblocks, each having a sequence of symbols. The symbols of said codeblocks are interleaved in a sequence of sync blocks each of which includes a sequence of symbols, at least one symbol from each code word. The symbols are reordered from a normal consecutive sequence in order to equalize the likelihood of a symbol corruption across the codeblocks of said digital data especially in systems where there is error propagation.

6 Claims, 5 Drawing Sheets

ECC CODE BLOCK "A":   A1 A2 A3 A4 A5 A6 A7 A8
                              A9 A10 A11 A12 A13 A14 A15 A16

ECC CODE BLOCK "B":   B1 B2 B3 B4 B5 B6 B7 B8
                              B9 B10 B11 B12 B13 B14 B15 B16

. . .

ECC CODE BLOCK "G":   G1 G2 G3 G4 G5 G6 G7 G8
                              G9 G10 G11 G12 G13 G14 G15 G16

| | SYNC | | SYNC | | SYNC | | SYNC | |
|---|---|---|---|---|---|---|---|---|
| TRACK 1 | A1 B1 C1 D1 E1 F1 G1 | SYNC | A5 B5 C5 D5 E5 F5 G5 | SYNC | A9 B9 C9 D9 E9 F9 G9 | SYNC | A13 B13 C13 D13 E13 F13 G13 | |
| TRACK 2 | A2 B2 C2 D2 E2 F2 G2 | SYNC | A6 B6 C6 D6 E6 F6 G6 | SYNC | A10 B10 C10 D10 E10 F10 G10 | SYNC | A14 B14 C14 D14 E14 F14 G14 | |
| TRACK 3 | A3 B3 C3 D3 E3 F3 G3 | SYNC | A7 B7 C7 D7 E7 F7 G7 | SYNC | A11 B11 C11 D11 E11 F11 G11 | SYNC | A15 B15 C15 D15 E15 F15 G15 | |
| TRACK 4 | A4 B4 C4 D4 E4 F4 G4 | SYNC | A8 B8 ~~C8 D8 E8 F8 G8~~ | SYNC | A12 B12 C12 D12 E12 F12 G12 | SYNC | A16 B16 C16 D16 E16 F16 G16 | |

SYNC FIELD     SYNC BLOCK     DROP-OUT

FIG. 1

ECC CODE BLOCK "A":  A1 A2 A3 A4 A5 A6 A7 A8
                     A9 A10 A11 A12 A13 A14 A15 A16

ECC CODE BLOCK "B":  B1 B2 B3 B4 B5 B6 B7 B8
                     B9 B10 B11 B12 B13 B14 B15 B16

. . .

ECC CODE BLOCK "G":  G1 G2 G3 G4 G5 G6 G7 G8
                     G9 G10 G11 G12 G13 G14 G15 G16

| | | | | | | | | |
|---|---|---|---|---|---|---|---|---|
| TRACK 1 | SYNC | A1 B1 C1 D1 E1 F1 G1 | SYNC | A5 B5 C5 D5 E5 F5 G5 | SYNC | A9 B9 C9 D9 E9 F9 G9 | SYNC | A13 B13 C13 D13 E13 F13 G13 |
| TRACK 2 | SYNC | G2 F2 E2 D2 C2 B2 A2 | SYNC | G6 F6 E6 D6 C6 B6 A6 | SYNC | G10 F10 E10 D10 C10 B10 A10 | SYNC | G14 F14 E14 D14 C14 B14 A14 |
| TRACK 3 | SYNC | A3 B3 C3 D3 E3 F3 G3 | SYNC | A7 B7 C7 D7 E7 F7 G7 | SYNC | A11 B11 C11 D11 E11 F11 G11 | SYNC | A15 B15 C15 D15 E15 F15 G15 |
| TRACK 4 | SYNC | G4 F4 E4 D4 C4 B4 A4 | SYNC | G8 F8 E8 D8 C8 B8 A8 | SYNC | G12 F12 E12 D12 C12 B12 A12 | SYNC | G16 F16 E16 D16 C16 B16 A16 |

SYNC FIELD — SYNC BLOCK

FIG. 2

ECC CODE BLOCK "A": A1 A2 A3 A4 A5 A6 A7 A8
A9 A10 A11 A12 A13 A14 A15 A16

ECC CODE BLOCK "B": B1 B2 B3 B4 B5 B6 B7 B8
B9 B10 B11 B12 B13 B14 B15 B16

...

ECC CODE BLOCK "G": G1 G2 G3 G4 G5 G6 G7 G8
G9 G10 G11 G12 G13 G14 G15 G16

| | | | |
|---|---|---|---|
| G13 F13 E13 D13 C13 B13 A13 | G14 F14 E14 D14 C14 B14 A14 | G15 F15 E15 D15 C15 B15 A15 | G16 F16 E16 D16 C16 B16 A16 |
| SYNC | SYNC | SYNC | SYNC |
| A9 B9 C9 D9 E9 F9 G9 | A10 B10 C10 D10 E10 F10 G10 | A11 B11 C11 D11 E11 F11 G11 | A12 B12 C12 D12 E12 F12 G12 |
| SYNC | SYNC | SYNC | SYNC |
| G5 F5 E5 D5 C5 B5 A5 | G6 F6 E6 D6 C6 B6 A6 | G7 F7 E7 D7 C7 B7 A7 | G8 F8 E8 D8 C8 B8 A8 |
| SYNC | SYNC | SYNC | SYNC |
| A1 B1 C1 D1 E1 F1 G1 | A2 B2 C2 D2 E2 F2 G2 | A3 B3 C3 D3 E3 F3 G3 | A4 B4 C4 D4 E4 F4 G4 |
| SYNC | SYNC | SYNC | SYNC |

SYNC BLOCK

SYNC FIELD

TRACK 1, TRACK 2, TRACK 3, TRACK 4

FIG. 3

ECC CODE BLOCK "A":   A1 A2 A3 A4 A5 A6 A7 A8
                      A9 A10 A11 A12 A13 A14 A15 A16

ECC CODE BLOCK "B":   B1 B2 B3 B4 B5 B6 B7 B8
                      B9 B10 B11 B12 B13 B14 B15 B16

. . .

ECC CODE BLOCK "G":   G1 G2 G3 G4 G5 G6 G7 G8
                      G9 G10 G11 G12 G13 G14 G15 G16

| | | | | | | | | | | | |
|---|---|---|---|---|---|---|---|---|---|---|---|
| TRACK 1 | SYNC | A1 C1 E1 D1 B1 G1 F1 | SYNC | C5 F5 B5 D5 G5 E5 A5 | SYNC | G9 B9 A9 E9 C9 F9 D9 | SYNC | F13 G13 E13 D13 C13 B13 A13 |
| TRACK 2 | SYNC | B2 E2 D2 G2 F2 C2 A2 | SYNC | D6 G6 E6 B6 A6 F6 C6 | SYNC | C10 G10 D10 F10 E10 A10 B10 | SYNC | E14 D14 C14 A14 F14 G14 B14 |
| TRACK 3 | SYNC | G3 E3 A3 C3 B3 D3 | SYNC | E7 B7 C7 F7 D7 A7 G7 | SYNC | A11 F11 C11 G11 E11 B11 D11 | SYNC | D15 E15 A15 F15 C15 B15 G15 |
| TRACK 4 | SYNC | F4 A4 C4 B4 G4 D4 E4 | SYNC | A8 D8 E8 C8 B8 G8 F8 | SYNC | B12 A12 E12 D12 G12 F12 C12 | SYNC | G16 E16 A16 C16 B16 D16 F16 |

SYNC FIELD — SYNC BLOCK

FIG. 4

ERROR MINIMIZATION IN INTERLEAVED ERROR CORRECTING CODES

FIELD OF THE INVENTION

This invention relates in general to digital data systems and more particularly to digital data systems using block-oriented formatting in which errors are minimized through selective ordering of interleaved error correcting codes for multiple track recording.

BACKGROUND OF THE INVENTION

In a multitrack data recording system which uses block-oriented formatting, the dominating error scenarios are often drop-out, or burst, type errors. Most systems use conventional interleaving and periodic resynchronization to distribute the effect of burst errors across a number of ECC codeblocks, such that each codeblock need only deal with a small number of errors.

FIG. 1 shows an example of a conventional block-oriented multi-track recording format. For the purposes of illustration, a four track, four interleave format with a sixteen symbol ECC Codeblock is shown, but the approaches outlined apply to systems which have more (or fewer) tracks and interleave blocks and different sized ECC Codeblocks. A collection of symbols (which may be bits, bytes, or some other sized representation) is formed, to which some additional symbols are added, to create, as an example, an error correction code (ECC) codeblock "A", depicted as symbols A1, A2, A3, . . . , A16. This ECC Codeblock is formulated such that it is mathematically possible to detect and correct several symbols in the ECC codeblock in the event that they become altered in some way. (The use of error correction codes is well known to one skilled in the art of digital data systems.) A problem arises, however, because any given code scheme has only a limited error detection and correction capability, i.e., it will only be able to detect and correct a finite number of altered symbols. If that limit is exceeded, the error situation cannot be corrected, resulting in a loss of data.

With most conventional data recovery schemes, once a drop-out or burst error occurs, accurate data recovery is no longer possible until a "resynchronization" of the recovery system with the data has taken place. This is usually accomplished with the use of a "Sync Field", which is some pattern which the data recovery system uses to find its place in the data stream and accomplish accurate symbol synchronization. Referring again to FIG. 1, a dropout is shown as corrupting symbols C8, D8, E8, F8, and G8. The combination of a "Sync Field" with a "Data Field" is termed a "Sync Block". All systems which use resynchronization have formats which are comprised of a string of sync blocks on each track. Whenever the sync field of a sync block is encountered by the data recovery system, the system resynchronizes itself to the symbols on the track. This process occurs independently on individual tracks of a multi-track system. This way, if synchronization is lost due to a dropout or burst error, it will be restored at the beginning of the next sync block. (This is also the way synchronization is established at the beginning of a data recovery session.)

In a dropout or burst error dominated system, it is desirable to distribute the effect of an error across as many ECC codeblocks as possible, such that each one will have a minimum number of errors/alterations to be corrected. To this end, interleaving is used. In interleaving, the symbols of any given ECC codeblock are distributed across all available tracks of a multitrack system and interleaved across all available sync blocks on a track. In general practice, it is highly desirable to have only one or two symbols of any given ECC codeblock residing in any given sync block on any given track. Referring to FIG. 1 again, ECC codeblock A, consisting of symbols A1, A2, . . . , A16, is interleaved across all four tracks, and has one symbol per sync block. Similarly, ECC codeblock B, consisting of symbols B1, B2, . . . , B16, is interleaved in the same manner and so on.

Thus, taken together, error correction codes, resynchronization, and interleaving will distribute the effect of a burst error such that any symbol alterations or errors will be shared by as many ECC codeblocks as possible. This minimizes the possibility that the correction capability of any given ECC codeblock will be exceeded. Thus, in FIG. 1, even though the dropout has corrupted five consecutive symbols, each symbol belongs to a different ECC codeblock. Hence, each of the ECC codeblocks C, D, E, F, and G will only have to detect and correct one symbol each.

A problem with conventional interleaving arises from the fact that errors tend to propagate to the end of the sync block. Thus, ECC codeblocks which have their symbols near the end of the various sync blocks have a higher probability of having their symbols corrupted (i.e., in the example of FIG. 1, the likelihood that ECC codeblock G will have an error is higher than ECC codeblock A.)

U.S. Pat. No. 5,299,208, issued Mar. 29, 1994, inventors Blame, et al., discloses enhanced decoding of interleaved error correcting codes including interleaving encoded bytes of successive code words diagonally in a single continuous sequence to form an array with a toroidal topology. In this manner, all burst errors will be continuous from code word to code word, irrespective of where they occur in the array.

Commonly assigned U.S. Pat. No. 5,068,878, issued Nov. 26, 1991, inventors Lin and Shon, discloses a method and apparatus for data interleave with pseudo-randomized resynchronization sequences throughout a page of interleaved code words. Errors due to tape dropouts are thus randomized and more likely to be correctable.

Neither of these patents fully addresses the problem of the tendency of errors propagating to the end of a sync block and do not yield a truly even distribution of errors.

SUMMARY OF THE INVENTION

According to the present invention, there is provided a solution to the problems noted above. According to one aspect of the present invention, a digital data system using a block-oriented format with sync fields and interleaving is provided in which the order of the symbols in alternating tracks is reversed from each other for all sync blocks. According to another aspect of the present invention, a digital data system using a block-oriented format with sync fields and interleaving is provided in which the order of symbols for alternating sync blocks is reversed from each other for all tracks. According to still another aspect of the present invention, a digital data system using a block-oriented format with sync fields and interleaving is provided in which the order of symbols for a given track follows a predetermined, pseudo-random sequence which is different from track to track.

BRIEF DESCRIPTION OF THE DRAWINGS

FIG. 1 is a diagrammatic view of a conventional ECC/Resynchronization/interleave scheme.

FIG. 2 is a diagrammatic view of one embodiment of the present invention showing a bi-directional interleave scheme with track alternation.

FIG. 3 is a diagrammatic view of another embodiment of the present invention showing a bi-directional interleave scheme with block alternation.

FIG. 4 is a diagrammatic view of another embodiment of the present invention showing pseudo-random symbol ordering which is different from track to track, block to block, etc.

DESCRIPTION OF THE PREFERRED EMBODIMENTS

Figure 5:
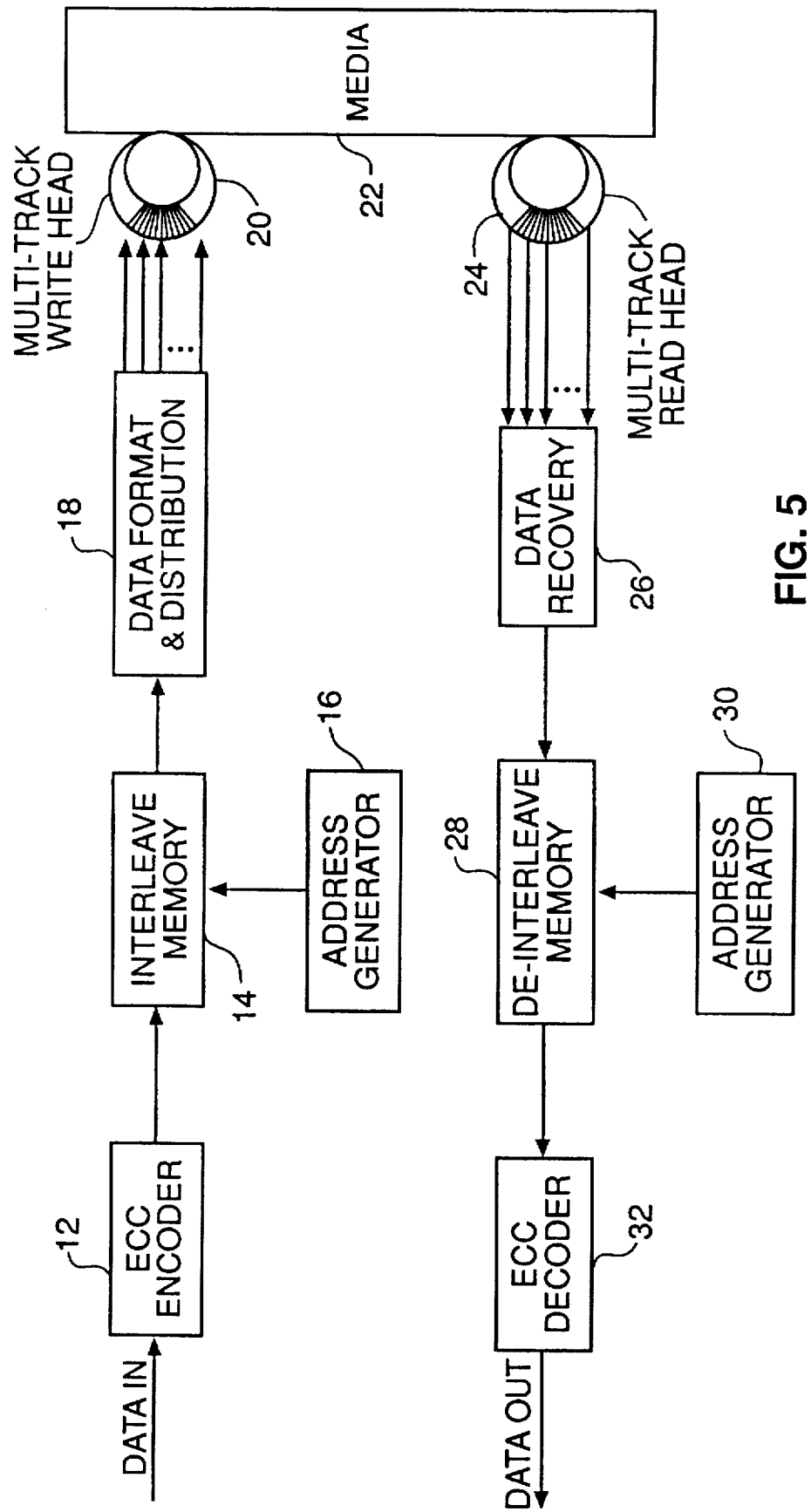
FIG. 5 is a block diagram of a digital data system incorporating the present invention.

Although the present invention will be described below as incorporated in a multitrack recording system, it will be understood that the invention is applicable to other digital data systems using a block oriented format with interleaving. The invention is applicable to both magnetic and optical recording as well as transmission through communication channels.

Referring now to FIG. 5, there will be described a multitrack recording system 10 incorporating the present invention. As shown, digital data is input to ECC encoder 12 which encodes the data into ECC code blocks. The encoded data is stored in interleave memory 14 with the ordering specified by address generator 16. Address generator 16 reads the digital data out of memory 14 in an interleave ordering according to the invention to be described later. The interleaved digital data is formatted with sync fields (and may be further encoded) and is applied to multiple record heads 20 through data format and distribution circuit 18. Heads 20 record the interleaved data on multiple tracks on media(e.g., magnetic media) 22.

Interleaved digital data is played back from media 22 by playback heads 24. The interleaved digital data is recovered by data recovery circuit 26 and stored in deinterleave memory 28 in the order specified by address generator 30. The digital data is read out of memory 28 in a deinterleaved block ordering which is corrected for errors by ECC decoder 32 to produce a stream of digital data out.

In a conventional interleaved/resynchronized digital data system, the probability of getting a symbol in error is higher for symbols which occur later in a synchronization block, since in most systems, a loss of synchronization will cause error propagation until the next resynchronization area. According to the present invention, there is provided a scheme which minimizes the effects of error propagation on later symbols in a sync block, by using a new interleave ordering. The invention includes several embodiments described below for reversing the order of the symbols in alternate tracks or in alternate sync blocks or for pseudo-randomly ordering the symbols from track to track and/or sync block to sync block.

Referring now to FIG. 2 there is shown one embodiment of the present invention showing bi-directional interleaving using track alternation. As compared to the conventional interleaving shown in FIG. 1, the order of the symbols within each sync block in tracks 2 and 4 have been reversed. Thus, on track 2, instead of the symbol from ECC codeblock A coming first, the symbol from ECC codeblock G comes first followed by F, E, etc. This alternate reverse ordering has the effect of equalizing the likelihood that any given dropout will cause a corrupted symbol in any given ECC codeblock.

Referring to FIG. 3, another embodiment of the present invention is shown, in which there is bi-directional interleaving using sync block alternation. As compared to the conventional interleaving shown in FIG. 1, the order of the symbols within every other sync block on all tracks is reversed. For example, in the second and fourth sync block of each track, instead of the symbol from ECC codeblock A coming first, the symbol from ECC codeblock G comes first, followed by F, E, etc. This symbol ordering, again, has the effect of equalizing the likelihood that any given dropout will cause a corrupted symbol in any given ECC codeblock.

Referring now to FIG. 4, there is shown another embodiment of the present invention, in which the symbols down a track follow a predetermined, pseudo random sequence for each track, thus achieving a truly scrambled system. The ordering would be different from track to track and arranged such that the likelihood of a symbol from a given ECC codeblock would occur in a particular position down the track is equiprobable.

The invention has been disclosed in detail with respect to preferred embodiments thereof, but it will be understood that variations and modifications can be effected within the spirit and scope of the invention.

Parts List 10 multitrack recording system
12 ECC encoder
14 interleave memory
16 address generator
18 distribution circuit
20 multiple record heads
22 magnetic media
24 playback heads
26 data recovery circuit
28 deinterleave memory
30 address generator
32 ECC decoder

What is claimed is:

1. A method of interleaving digital data comprising the steps of:

providing digital data including a sequence of codeblocks each having a sequence of symbols; and interleaving said symbols of said codeblocks in a sequence of sync blocks each of which includes a sequence of symbols, at least one symbol from each codeblock, wherein the symbols are reordered from a normal consecutive sequence in order to equalize the likelihood of a symbol corruption across the codeblocks of said digital data.

2. The method of claim 1 wherein in said interleaving step, said sync blocks are arrayed in a plurality of channels and wherein the symbols in alternate channels are reordered so that the symbols are reversed.

3. The method of claim 1 wherein in said interleaving step, said sync blocks are arrayed in a plurality of parallel channels, and wherein the symbols in alternate sync blocks in each of said parallel channels are reversed.

4. The method of claim 1 wherein in said interleaving step, said sync blocks are arrayed in a plurality of parallel channels, and wherein the symbols of the sync blocks in a channel are reordered in a prescribed, pseudo-random sequence, and wherein said sequence is different from channel to channel.

5. The method of claim 1 wherein in said interleaving step, said sync blocks are arrayed in at least one channel, and wherein the symbols in alternate sync blocks in said at least one channel is reversed.

6. The method of claim 1 wherein in said Interleaving step, said sync blocks are arrayed in at least one channel, and wherein the symbols of the sync blocks in said at least one channel are reordered in a prescribed, pseudo-random sequence.

* * * * *

UNITED STATES PATENT AND TRADEMARK OFFICE
CERTIFICATE OF CORRECTION

PATENT NO. : 5,796,755
DATED : 18 August 1998
INVENTOR(S) : Russell D. Shon

It is certified that error appears in the above-identified patent and that said Letters Patent is hereby corrected as shown below:

```
Title page,insert the following item:
    --[60] Provisional Application No. 60/005,120 Oct. 10, 1995.--

Column 1, line 3, insert the following:
    CROSS REFERENCE TO RELATIED APPLICATION
Reference is made to and priority claimed from U.S. Provisional
Application Ser. No. 60/005,120, filed Oct. 10, 1995, entitled
ERROR MINIMIZATION IN INTERLEAVED ERROR CORRECTING CODES.--
```

Signed and Sealed this

Twenty-second Day of December, 1998

Attest:

BRUCE LEHMAN

*Attesting Officer*                *Commissioner of Patents and Trademarks*